United States Patent [19]
Yazdy et al.

[11] Patent Number: 5,500,827
[45] Date of Patent: Mar. 19, 1996

[54] METHOD AND APPARATUS FOR IMPROVED DRAM REFRESH OPERATION

[75] Inventors: Farid A. Yazdy, Belmont; Michael J. Dhuey, Cupertino, both of Calif.

[73] Assignee: Apple Computer, Inc., Cupertino, Calif.

[21] Appl. No.: 514,367

[22] Filed: Aug. 11, 1995

Related U.S. Application Data

[63] Continuation of Ser. No. 326,793, Oct. 20, 1994, which is a continuation of Ser. No. 215,204, Mar. 21, 1994, abandoned, which is a continuation of Ser. No. 850,479, Mar. 12, 1992, abandoned.

[51] Int. Cl.$^6$ .............................. G11C 11/24; G11C 11/40
[52] U.S. Cl. .................................... 365/222; 365/233
[58] Field of Search ................................... 365/222, 233

[56] References Cited

U.S. PATENT DOCUMENTS 3,737,879  6/1973  Greene et al. ........................... 365/222

FOREIGN PATENT DOCUMENTS

| | | |
|---|---|---|
| 0145413 | 6/1985 | European Pat. Off. . |
| 0223962 | 9/1986 | European Pat. Off. . |
| 2026218 | 1/1980 | United Kingdom . |
| 2095442 | 9/1982 | United Kingdom . |
| 2116338 | 9/1983 | United Kingdom . |
| 2153116 | 8/1985 | United Kingdom . |

*Primary Examiner*—Terrell W. Fears
*Attorney, Agent, or Firm*—V. Randall Gard; John S. Ferrell; Eppa Hite

[57] ABSTRACT

The present invention facilitates the Dynamic Random Access Memory (DRAM) refresh function in a less obtrusive manner than in the prior art. The present invention facilitates the refresh function during idle time when the DRAM is not busy handling read or write transactions. If insufficient idle time exists then the present invention will force a refresh operation thus ensuring that all memory cells are maintained in a properly charged state.

22 Claims, 5 Drawing Sheets

METHOD AND APPARATUS FOR IMPROVED DRAM REFRESH OPERATION

This is a continuation of application Ser. No. 08/326,793, filed on Oct. 20, 1994, which is a continuation of application Ser. No. 08/215,204 filed Mar. 21, 1994 now abandoned which is a continuation of Ser. No. 07/850,479 filed Mar. 12, 1992 now abandoned.

FIELD OF THE INVENTION

The present invention relates to the field of memory devices used in modern computer and electronic devices. More particularly, the present invention relates to the refresh requirement of Dynamic Random Access Memory (DRAM).

BACKGROUND OF THE INVENTION

Dynamic Random Access Memory (DRAM) memory cells are basically charge-storage capacitors with driver transistors. In other words, data is stored on a tiny capacitor within each memory cell. The presence or absence of charge in a capacitor is interpreted by the DRAM's sense line as a logical 1 or 0.

Because of a charge's natural tendency to distribute itself into a lower energy-state, however, DRAMs require periodic charge refreshing to maintain data storage. Stated differently, due to leakage the data may leak off after a period of time. To maintain data integrity, it is necessary to refresh each of the DRAM memory rows within this period of time. A refresh operation generally comprises copying the data held in the memory cells into one or more registers and then copying the data in the registers back into the memory cells.

Traditionally, this refresh requirement has required additional circuitry to handle the DRAM subsystem refresh. And when refresh procedures made the DRAM unavailable for reading and writing the memory's control circuitry had to arbitrate for access.

It is common in the prior art for the memory control circuitry to intercede between read or write transactions in order to facilitate the refresh function. This unfortunately delays transactions which must wait while a refresh operation completes before being serviced.

The present invention facilitates the DRAM refresh function in a less obtrusive manner than in the prior art. This is accomplished by facilitating the refresh function during idle time when the DRAM is not busy handling read or write transactions. If insufficient idle time exists then the present invention will force a refresh operation thus ensuring that all memory cells are maintained in a properly charged state.

SUMMARY AND OBJECTS OF THE INVENTION

An objective of the present invention is to provide an improved method for refreshing Dynamic Random Access Memory (DRAM).

A further objective of the present invention is to provide an improved apparatus for refreshing Dynamic Random Access Memory (DRAM).

The foregoing and other advatages are provided by an improved refresh method for performing a refresh operation on Dynamic Random Access Memory (DRAM) during a refresh cycle said improved refresh method comprising the steps of i) if said DRAM becomes idle during a predetermined time period following the beginning of said refresh cycle, then performing said refresh operation during said idle DRAM time; and, ii) if said DRAM does not become idle during said predetermined time period following the beginning of said refresh cycle, then performing said refresh operation after any DRAM transaction occurring at the end of said predetermined time period following the beginning of said refresh cycle.

The foregoing and other advantages are also provided by an improved refresh apparatus for performing a refresh operation on Dynamic Random Access Memory (DRAM) during a refresh cycle such that if said DRAM becomes idle during a predetermined time period following the beginning of said refresh cycle, then said improved refresh apparatus performs said refresh operation during said idle DRAM time but if said DRAM does not become idle during said predetermined time period following the beginning of said refresh cycle, then said improved refresh apparatus performs said refresh operation after any DRAM transaction occurring at the end of said predetermined time period following the beginning of said refresh cycle.

BRIEF DESCRIPTION OF THE DRAWINGS

The present invention is illustrated by way of example and not limitation in the figures of the accompanying drawings, in which like references indicate similar elements, and in which.

DETAILED DESCRIPTION

Dynamic Random Access Memory (DRAM) memory cells require periodic charge refreshing to maintain data storage. It is common in the prior art for memory control circuitry to intercede between successive read or write transactions in order to facilitate the refresh function in a forced manner. Forced refresh operations delay subsequent DRAM transactions.

Figure 1:
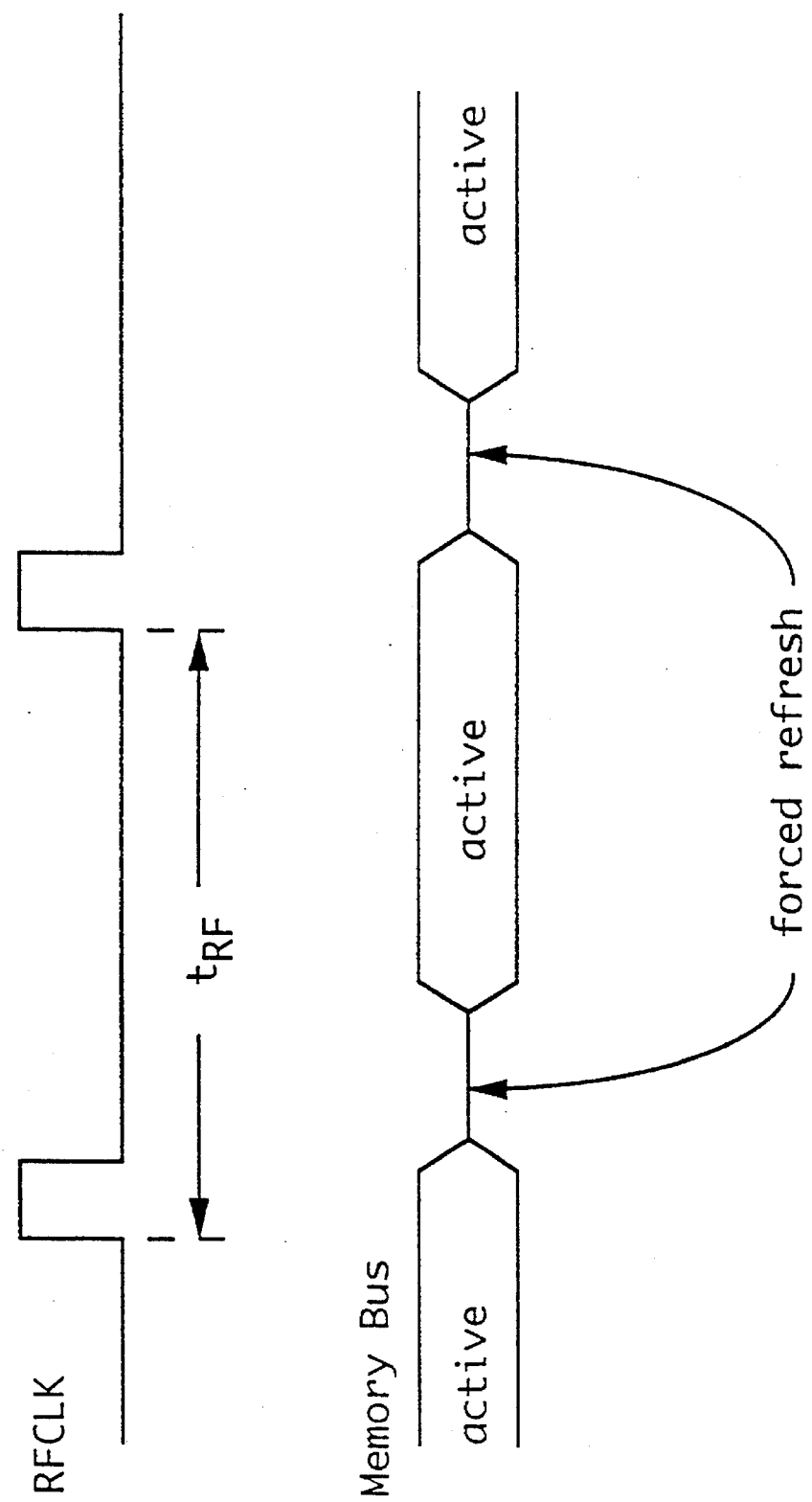
FIG. 1 is a simplified timing diagram of a forced refresh operation of the prior art.

Referring now to FIG. 1, a timing diagram of a typical forced refresh operation will be explained. A Refresh Clock (RFCLK) timing signal indicates when it is time for a refresh cycle (every $t_{RF}$). In the prior art, when the RFCLK signal rises (at the beginning of $t_{RF}$) a forced refresh operation is executed as soon as any current read or write transaction completes. This can be seen in the figure where the memory bus is not active during the refresh operation because the DRAM is unavailable for access. Forced refresh operations thus delay any further read or write memory bus transactions until the refresh operation has completed. It is only after a refresh operation has completed that the memory bus is again available for transactions and can thus become active again. Unfortunately, this forced refresh operation of the prior art causes delay to subsequent transactions which must wait while the refresh operation completes.

Figure 2:
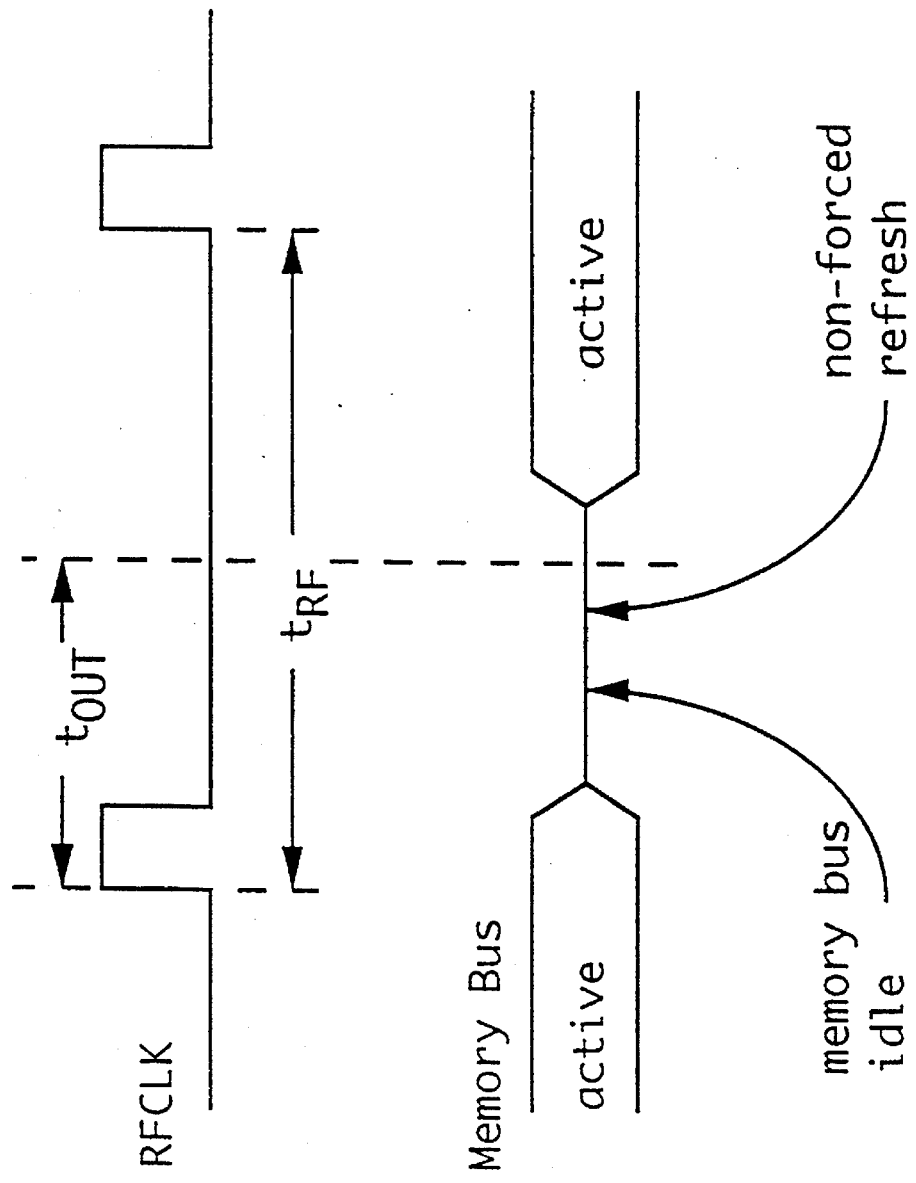
FIG. 2 is a simplified timing diagram of a non-forced refresh operation of the present invention.
Figure 3:
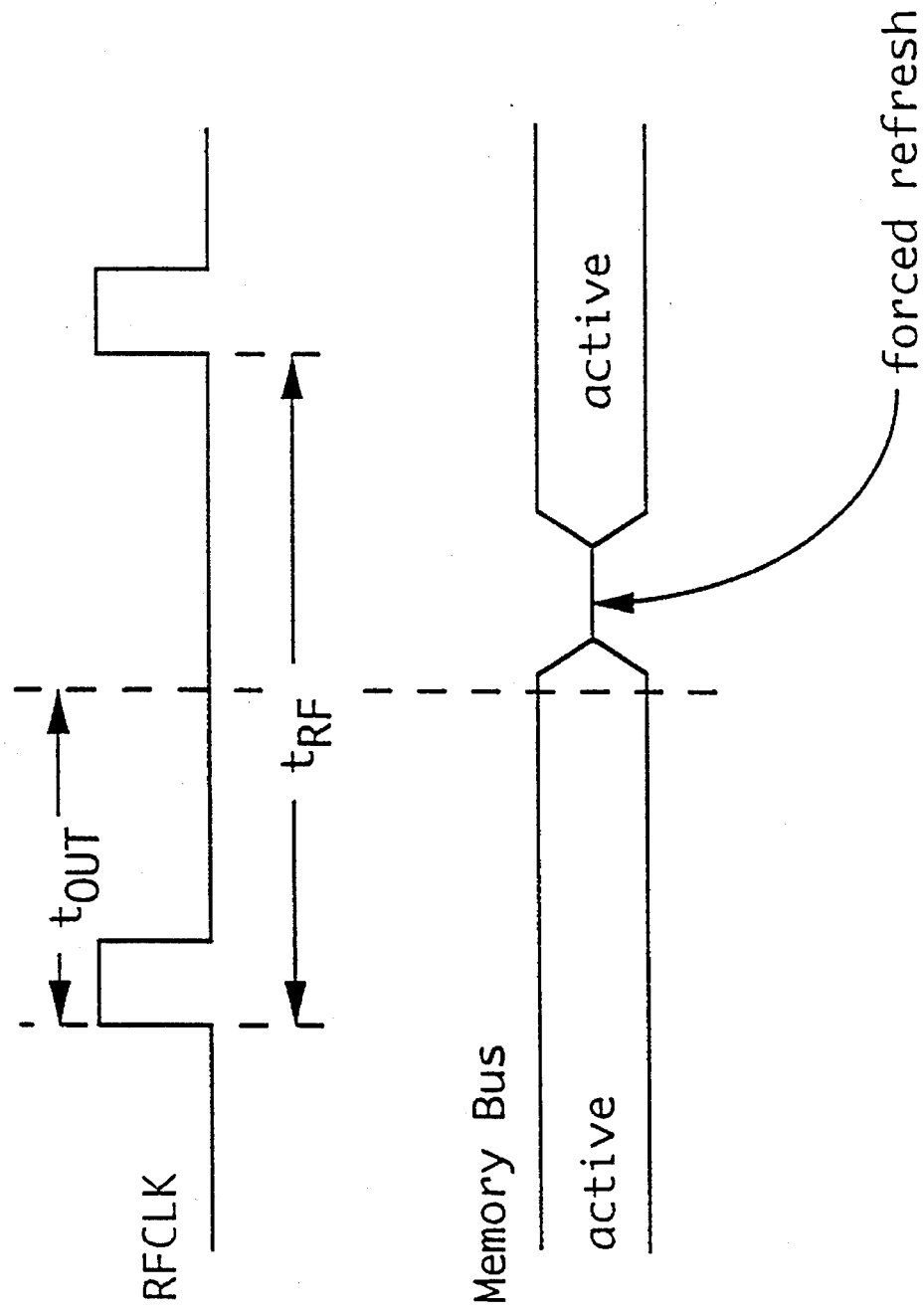
FIG. 3 is a simplified timing diagram of a forced refresh operation of the present invention.

Conversely, in the present invention, when RFCLK signals that it is refresh time (a cycle occurring every $t_{RF}$) a refresh operation is not immediately forced. Instead, when RFCLK signals the beginning of a refresh cycle in the present invention the memory bus is first checked to determine whether it is idle or busy. Referring now to FIG. 2, if the memory bus is or becomes idle (within a given time frame, as is explained more fully below) then a refresh cycle can commence without delaying any current memory bus transaction. This is shown in the figure as a period of time following the rise and fall of the RFCLK signal when the memory bus is idle (no DRAM bus transactions are occurring) and a non-forced refresh operation is executed. However, referring now to FIG. 3, if the memory bus is not idle and does not become idle (within a given time frame, as is explained more fully below) then a refresh cycle will be forced. This is shown in the figure where the refresh operation is handled as a forced operation thus causing the memory bus to become inactive as in the prior art. The technique of the present invention thus avoids impacting memory bus transactions where possible yet still ensures that all memory cells are maintained in a properly charged state.

Figure 4:
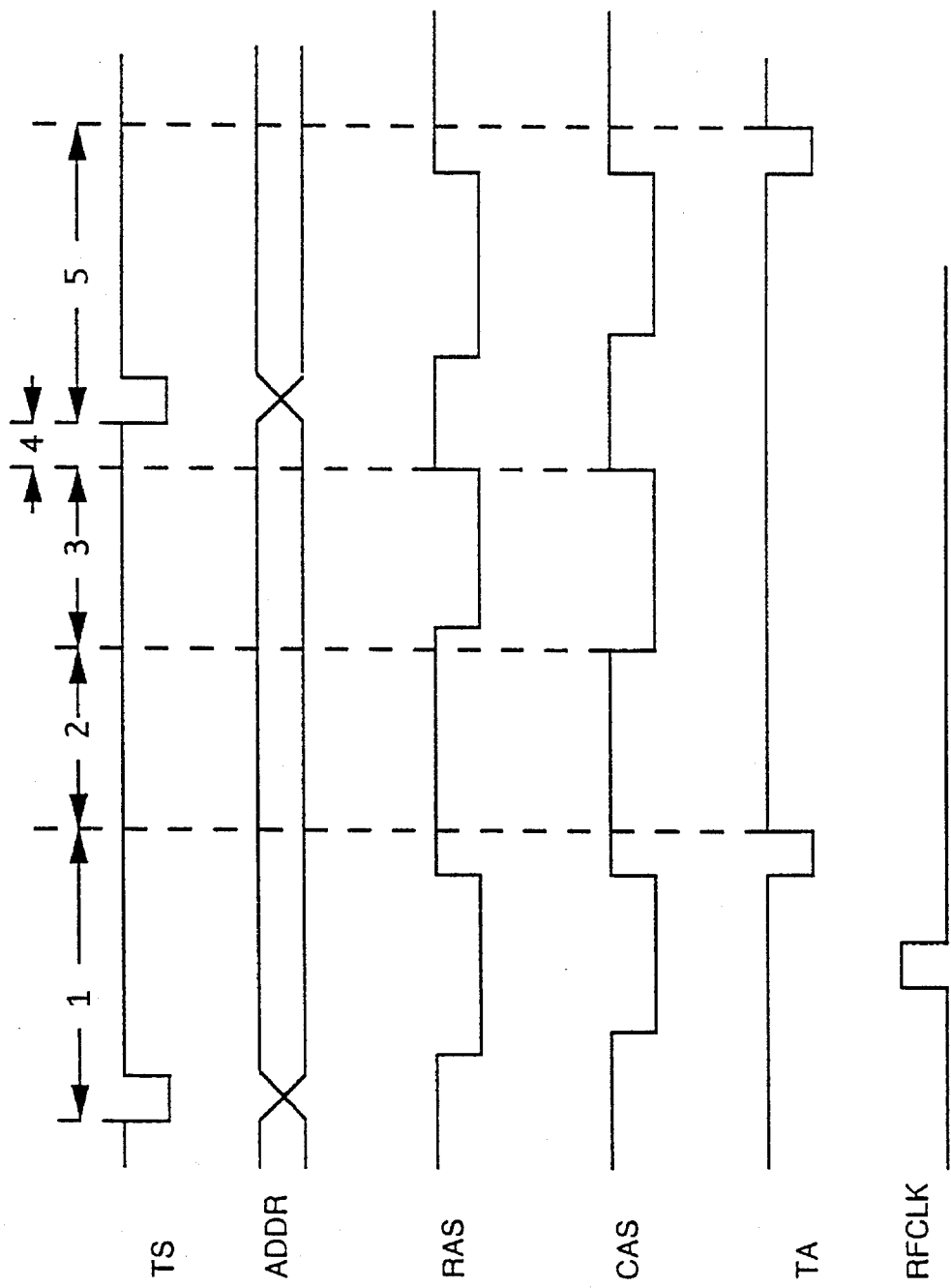
FIG. 4 is a more detailed timing diagram of a non-forced refresh operation of the present invention.

The technique of the present invention will now be explained in greater detail. Referring now to FIG. 4, a non-forced refresh which occurs during idle memory bus time will first be explained. In the preferred embodiment of the present invention, memory bus transactions begin with a Transfer Start (TS) signal, as is shown in the figure at the beginning of time period 1. The TS signal indicates to the memory that a memory master (such as a processor) wishes to read to or write from the memory. The TS signal is accompanied by a Memory Address (ADDR) signal, as is shown in the figure. The ADDR signal is decoded by the memory controller and both Row Address Strobe (RAS) and Column Address Strobe (CAS) signals are then sent by the memory controller to the memory device during time period 1. After the RAS and CAS signals are sent to the memory device then a Transfer Acknowledge (TA) signal is sent back to the memory master to indicate that either the data requested is being transmitted (in the case of a memory read) or the data sent has been received (in the case of a memory write). This thus completes the memory bus transaction of time period 1. Note that the TS, TA, CAS, and RAS signals are all active low in the preferred embodiment of the present invention.

Referring again to FIG. 4, note that the RFCLK signal indicated the beginning of a refresh cycle during the memory bus transaction of time period 1. In the present invention, rather than immediately force a refresh operation and delay any subsequent transactions, the memory controller first checks to see if there is any idle time on the memory bus. The memory controller checks for idle time on the memory bus by checking the TS and the TA signal lines. If there is no activity on the TS signal line (which indicates the beginning of a memory bus transaction) immediately after the TA signal (which indicates the end of a memory bus transaction) has gone from active to inactive then the memory bus is idle. This is shown in the figure as time period 2 where there is no TS signal immediately following the TA signal of time period 1.

If the memory bus is idle then the memory controller can immediately begin a non-forced refresh operation. The non-forced refresh operation can be seen in the figure during time period 3 as a CAS-before-RAS operation as used in the preferred embodiment of the present invention (where the CAS signal going active before the RAS signal going active triggers the refresh operation-a technique well known in the art which eliminates the need for external refresh addresses). The non-forced refresh operation of the present invention has the advantage of avoiding memory bus contention avoiding and delaying subsequent transactions because the non-forced refresh operation is occurring during idle memory time.

Subsequent transactions can commence after the non-forced refresh operation has completed. This is shown in the figure where idle memory bus time period 4 (which followed the non-forced refresh operation of the present example) is followed by another memory bus transaction during time period 5. Note that the memory bus transaction of time period 5 follows the same signal sequence as the memory bus transaction of time period 1.

Figure 5:
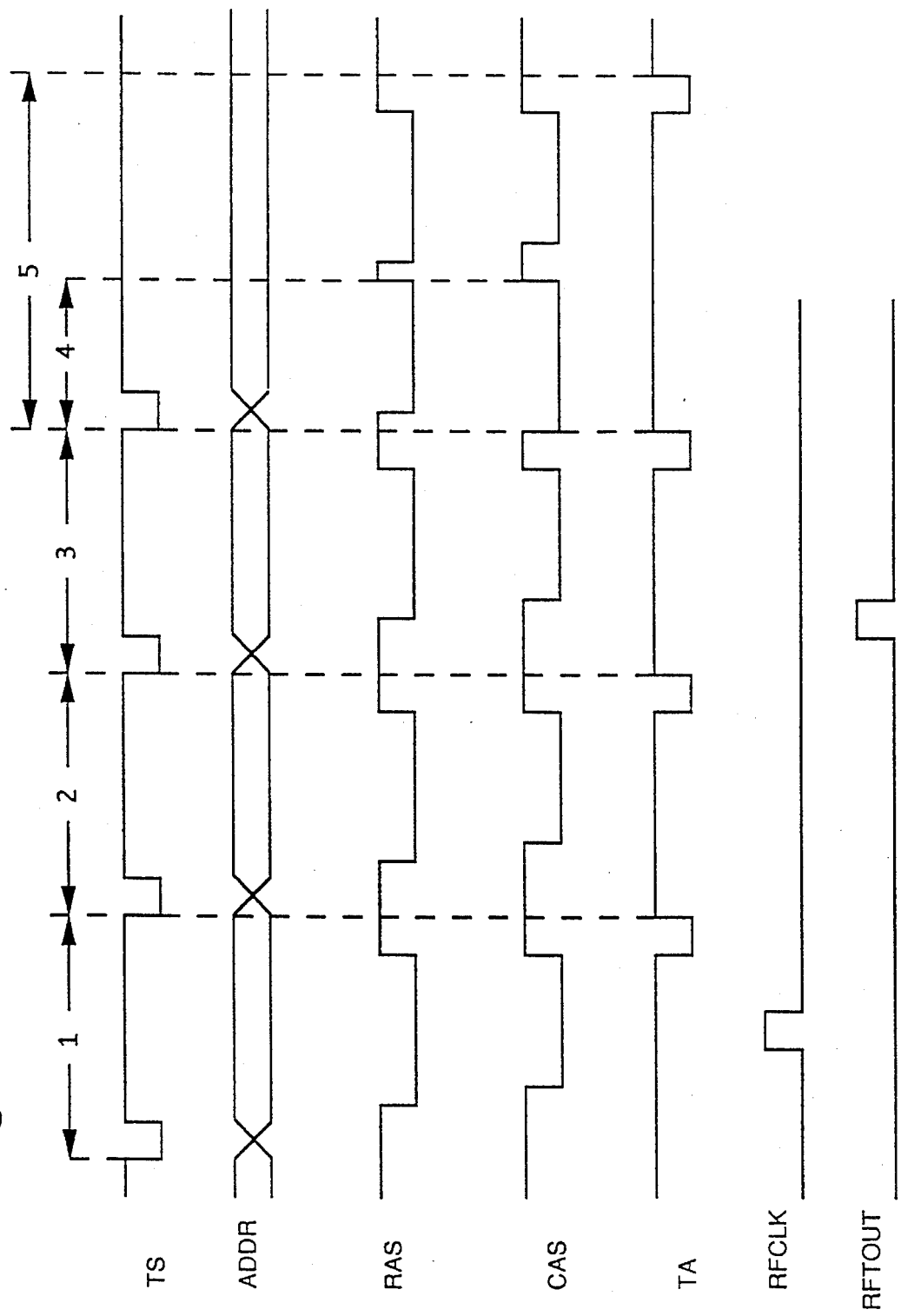
FIG. 5 is a more detailed timing diagram of a forced refresh operation of the present invention.

Referring now to FIG. 5, a forced refresh operation of the present invention, which occurs during active (non-idle) memory bus time after attempting to find idle memory bus time in which a non-forced refresh operation could be executed, will now be explained. As explained above, memory bus transactions of the preferred embodiment of the present invention begin with a Transfer Start (TS) signal accompanied by a Memory Address (ADDR), as is shown in the figure at the beginning of time period 1. The ADDR signal is decoded by the memory controller and both Row Address Strobe (RAS) and Column Address Strobe (CAS) signals are then sent by the memory controller to the memory device during time period 1. After the RAS and CAS signals are sent to the memory device then a Transfer Acknowledge (TA) signal is sent back to the memory master to complete the transaction at the end of time period 1 in the figure and as was explained above.

After one transaction, another read or write transaction may be immediately initiated by the same or another memory bus master. This is shown in the figure by the second TS signal (at the beginning of time period 2) immediately following the first TA signal (at the end of time period 1). Note that this consecutive memory bus transaction sequence does not proceed in the same manner as in the prior art. However, the present invention operates differently when it is time for a refresh cycle to begin, as will now be explained.

Referring again to FIG. 5, note that the RFCLK signal indicated the beginning of a refresh cycle during the memory bus transaction of time period 1. In the present invention, rather than immediately forcing a refresh operation and delaying any subsequent transactions, the memory controller first checks to see if there is any idle time on the memory bus (as was explained above with reference to FIG. 4).

In the example of FIG. 5, however, there is activity on the TS signal line immediately after the activity on the TA signal line which thus indicates that the memory bus is active/busy (not idle) with another transaction. With the technique of the present invention, when the memory bus is active the memory controller waits (i.e., does not force a refresh operation) to see if the memory bus will become idle. Waiting until the memory bus becomes idle allows a non-forced refresh operation which avoids delaying subsequent transactions. Thus the memory controller of the present invention monitors the TA and TS signal lines in an attempt to find an idle memory bus period as indicated by a TA signal (indicating the end of a transaction) not immediately followed by a TS signal (indicating the beginning of another transaction). The technique of the present invention thus reduces memory bus contention because a refresh operation has not been forced and therefore no subsequent read or write transaction has been delayed or elongated.

However, if the memory bus does not become idle at any time during the refresh cycle then a forced refresh operation must still occur. This is because a refresh operation must occur at some point during the refresh cycle or else the charge on the memory cell capacitors could continue to leak until the data held was no longer reliable. Therefore, in the preferred embodiment of the present invention, a refresh operation is forced if the memory bus does not become idle within a given time period after the RFCLK signal has indicated the beginning of a refresh cycle. This thus ensures that a refresh operation always occurs and the data in the memory cells is maintained.

In the preferred embodiment of the present invention, if there is no idle time found on the memory bus within 7.8 micro seconds (uS) of the RFCLK signal indicating the beginning of a refresh cycle then a refresh operation will be forced. This ensures the completion of a refresh operation within the recommended refresh cycle time of 15.6 uS. In other words, if a non-forced refresh operation could not be commenced within 7.8 uS of the RFCLK signal indicating the beginning of a refresh cycle then a refresh operation will be forced just as it is in the prior art. While a forced refresh operation would still potentially impact subsequent transaction response time as it does in the prior art, a refresh operation is forced in the preferred embodiment of the present invention only when a non-forced refresh operation (hence when the memory bus is idle) was unable to commence during the first 7.8 uS of the 15.6 uS refresh cycle. Note that 7.8 uS is merely the preferred embodiment of the present invention (and is equal to one-half of the refresh cycle of 15.6 uS) and that any other time could be used so long as sufficient time remained to force a refresh operation within the total refresh cycle period of the particular DRAM memory device used.

A forced refresh operation of the present invention (which, again, would only occur after a given time period spent waiting for idle memory bus time which didn't occur) will now be explained. Referring again to FIG. 5, note that the RFCLK signal indicated the beginning of a refresh cycle during the memory bus transaction of time period 1. Furthermore, note that the TS signal of the memory bus transaction of time period 2 immediately followed the TA signal of the memory bus transaction of time period 1 thus indicating that the memory bus is still active (not yet idle). Likewise, note that the TS signal of the memory bus transaction of time period 3 immediately followed the TA signal of the memory bus transaction of time period 2 thus indicating that the memory bus remains active (not yet idle). Note, however, that during the memory bus transaction of time period 3, a Refresh Time-Out (RFTOUT) signal (which, as stated above, always follows the RFCLK signal by 7.8 uS in the preferred embodiment of the present invention) has been raised. The RFTOUT signal indicates that a refresh operation is to be forced because the memory bus has not become idle in time to allow a non-forced refresh operation to be performed.

When the RFTOUT signal indicates that a refresh operation is to be forced, the memory controller waits until the end of the current memory bus transaction (the TA signal of the transaction of time period 3 in the present example) and then forces a refresh operation as in the prior art. The forced refresh operation can be seen as a CAS-before-RAS operation during time period 4 in the figure. Note that, as in the prior art, the subsequent memory bus transaction which initiated the TS signal at the beginning of time period 5 is delayed due to the forced refresh of overlapping time period 4. After the forced refresh operation of time period 4 has completed then the delayed subsequent memory bus transaction of time period 5 can continue as is shown in the figure.

In the preferred embodiment of the present invention burst mode transactions are also supported. Burst mode transactions, a feature commonly known in the art, support multiple memory accesses within a single read or write memory transaction. In the preferred embodiment of the present invention a burst mode transaction transfers four long words (of 32 bits each) of data between a bus master and the DRAM device in a single transaction. Because a burst mode transaction is handled as a single transaction only one TS signal is used for all four long words being transmitted. However, because there are four separate long words being transmitted, each long word has its own TA signal. As such, if a burst transaction is being performed, in the preferred embodiment of the present invention when the memory controller is checking the TS and TA signal lines for idle memory bus time then idle memory bus time is indicated by the lack of a TS signal after the fourth TA signal of the burst transaction.

In the foregoing specification, the invention has been described with reference to a specific exemplary embodiment and alternative embodiments thereof. It will, however, be evident that various modifications and changes may be made thereto without departing from the broader spirit and scope of the invention as set forth in the appended claims. The specification and drawings are, accordingly, to be regarded in an illustrative rather than a restrictive sense.

What is claimed is:

1. An improved refresh method for performing a refresh operation on a Dynamic Random Access Memory (DRAM), coupled to a memory bus, during a refresh cycle, said improved refresh method comprising the following steps:

a) determining whether said DRAM is idle by monitoring said memory bus for signals during a predetermined time period immediately following a beginning of a refresh cycle;

b) if said DRAM becomes idel during said predetermined time period following the beginning of said refresh cycle, then voluntarily performing said refresh operation beginning during said predetermined time; and c) if said DRAM does not become idle during said predetermined time period following the beginning of said refresh cycle, then mandatorily performing said refresh operation after completion of any DRAM transaction in process at the end of said predetermined time period.

2. The improved refresh method of claim 1 wherein said DRAM becomes idle if no read or write transactions are being performed on said DRAM.

3. The improved refresh method of claim 1 wherein said DRAM becomes idle if there is no Transfer Start (TS) signal immediately following a Transfer Acknowledge (TA) signal.

4. The improved refresh method of claim 1 wherein said DRAM becomes idle if there is no Transfer Start (TS) signal immediately following a Transfer Acknowledge (TA) signal in the case of a normal transaction or if there is no Transfer Start (TS) signal immediately following a fourth Transfer Acknowledge (TA) signal in the case of a burst mode transaction.

5. The improved refresh method of claim 2 wherein said predetermined time period is equal to one-half of said refresh cycle.

6. An improved refresh apparatus for performing a refresh operation on Dynamic Random Access Memory (DRAM) during a refresh cycle, said improved refresh apparatus comprising:

means for determining whether said DRAM is idle by monitoring a memory bus for signals during a predetermined time period immediately following a beginning of a refresh cycle;

means for performing said refresh operation voluntarily if said DRAM becomes idle during said predetermined time period following the beginning of said refresh cycle; and means for performing said refresh operation mandatorily after the completion of any DRAM transaction in process at the end of said predetermined time if said DRAM does not become idle during said predetermined time period.

7. The improved refresh apparatus of claim 6 wherein said DRAM becomes idle if no read or write transactions are being performed on said DRAM.

8. The improved refresh apparatus of claim 6 wherein said DRAM becomes idle if there is no transfer Start (TS) signal immediately following a Transfer Acknowledge (TA) signal.

9. The improved refresh apparatus of claim 6 wherein said DRAM becomes idle if there is no Transfer Start (TS) signal immediately following a Transfer Acknowledge (TA) signal in the case of normal transaction or if there is no Transfer Start (TS) signal immediately following a fourth Transfer Acknowledge (TA) signal in the case of a burst mode transaction.

10. The improved refresh apparatus of claim 7 wherein said predetermined time period is equal to one-half of said refresh cycle.

11. An improved method for performing a refresh operation on a Dynamic Random Access Memory (DRAM) device during a refresh cycle, said improved refresh method comprising performing said refresh operation:

i) during a first DRAM idle period, if a first DRAM idle period begins within a predetermined period following the beginning of said refresh cycle, else ii) starting after the end of any DRAM transaction in process at the end of said predetermined period, and before any successive DRAM transaction.

12. The improved refresh method of claim 11 wherein said DRAM idle period exists if no read or write transactions are being performed on said DRAM.

13. The improved refresh method of claim 11 wherein said DRAM idle period exists if there is no Transfer Start (TS) signal immediately following a Transfer Acknowledge (TA) signal.

14. The improved refresh method of claim 11 wherein said DRAM idle period exists if there is no Transfer Start (TS) signal immediately following a Transfer Acknowledge (TA) signal in the case of a normal transaction or if there is no Transfer Start (TS) signal immediately following a fourth Transfer Acknowledge (TA) signal in the case of a burst mode transaction.

15. The improved refresh method of claim 12 wherein said predetermined period is equal to one-half of said refresh cycle.

16. An improved refresh method for performing a refresh operation on Dynamic Random Access Memory (DRAM) during a refresh cycle, said improved refresh method comprising:

a) including in said refresh cycle
  i) a voluntary refresh portion starting at the beginning and continuing during a first predetermined time period of, said refresh cycle, and
  ii) a mandatory refresh portion following said first predetermined time period and continuing through the remainder of said refresh cycle;
b) during said voluntary refresh portion
  i) determining whether said DRAM is idle, and
  ii) if so, beginning performing a non-forced refresh operation; and
c) during said mandatory refresh portion
  i) determining whether a refresh operation occurred beginning during said volunatry refresh portion, and
  ii) if not, performing a forced refresh operation.

17. The improved refresh apparatus of claim 16 wherein said DRAM idle period exists if no read or write transactions are being performed on said DRAM.

18. The improved refresh apparatus of claim 16 wherein said DRAM idle period exists if there is no Transfer Start (TS) signal immediately following a Transfer Acknowledge (TA) signal.

19. The improved refresh apparatus of Claim 16 wherein said DRAM idle period exists if there is no Transfer Start (TS) signal immediately following a Transfer Acknowledge (TA) signal in the case of a normal transaction or if there is no Transfer Start (TS) signal immediately following a fourth Transfer Acknowledge (TA) signal in the case of a burst mode transaction.

20. The improved refresh apparatus of claim 17 wherein said predetermined period is equal to one-half of said refresh cycle.

21. The improved refresh apparatus of claim 20 wherein said refresh cycle is 15.6 uS.

22. An improved apparatus for performing a refresh operation on a Dynamic Random Access Memory (DRAM) device during a refresh cycle, said improved apparatus comprising:

i) means for determining if a first DRAM idle period begins during a predetermined period following the beginning of said refresh cycle and for performing said refresh operation during a first DRAM idle period;

ii) means for determining if a first DRAM transaction is occurring at the end of a predetermined period and performing said refresh operation after said first DRAM transaction; and iii) means for determining if neither a DRAM idle time has begun during said predetermined period nor a first DRAM transaction is occurring at the end of said predetermined period and then performing said refresh operation after said predetermined period.

\* \* \* \* \*

UNITED STATES PATENT AND TRADEMARK OFFICE
CERTIFICATE OF CORRECTION

PATENT NO. : 5,500,827
DATED : March 19, 1996
INVENTOR(S) : Yazdy et al.

It is certified that error appears in the above-indentified patent and that said Letters Patent is hereby corrected as shown below:

Column 6, line 35, delete "idel" and substitute —idle—

Column 7, line 32, after "i)" insert —starting—

Column 8, line 28, after "of claim" delete "16" and insert —22—

Column 8, line 21, after "of claim" delete "16" and insert —22—

Column 8, line 26, after "of Claim" delete "16" and insert —22—

Signed and Sealed this

Twenty-first Day of January, 1997

Attest:

BRUCE LEHMAN

*Attesting Officer*  *Commissioner of Patents and Trademarks*